United States Patent
Yu et al.

(12) 
(10) Patent No.: US 6,352,884 B1
(45) Date of Patent: Mar. 5, 2002

(54) METHOD FOR GROWING CRYSTALS HAVING IMPURITIES AND CRYSTALS PREPARED THEREBY

(75) Inventors: B. D. Yu; Osamu Sugino, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/528,250

(22) Filed: Mar. 17, 2000

(30) Foreign Application Priority Data

Mar. 19, 1999 (JP) .......................................... 11-074714

(51) Int. Cl.[7] .......................... H01L 21/00; H01L 21/84
(52) U.S. Cl. ...................... 438/166; 438/166; 438/413; 438/416; 438/442; 438/481
(58) Field of Search ......................... 438/166, 413–416, 438/442, 481

(56) References Cited

FOREIGN PATENT DOCUMENTS

| JP | 11-354840 | * | 6/1998 | ........... H01L/33/00 |
| JP | 2000-277435 | * | 3/1999 | ......... H01L/21/205 |
| JP | 2000-340511 | * | 3/1999 | ......... H01L/21/205 |

OTHER PUBLICATIONS

S. Maruno et al. "Surfactant–mediated epitaxy of Ge on Ga–terminated Si surfaces" Apr. 1996 Appl. Phys. Lett. vol. 68 No. 16 pp. 2213–2215.*
Materials Science Forum vols. 258–263 (1997) (pp. 799–803) Takeshi Nishimatsu, et al. Valance Controls and Codoping for Low–Resistivity n–Type Diamond by ab initio Molecular–Dynamics Simulation.

* cited by examiner

Primary Examiner—Matthew Smith
Assistant Examiner—Granvill D Lee, Jr.
(74) Attorney, Agent, or Firm—Rosenman & Colin LLP

(57) ABSTRACT

A method for forming a crystal layer including the steps of (1) supplying first impurity atoms onto a surface of a crystal substrate to form a surfactant layer adsorbed on the surface, (2) supplying nucleus atoms which bond with the first impurity atoms, (3) repeating step (2) until second impurity atoms are supplied in step (4), and (4) supplying second impurity atoms which bond with the first impurity atoms and the nucleus atoms to epitaxially grow a crystal layer including the nucleus atoms as a crystal nucleus material doped with the first and second impurity atoms. A co-dopant having a three-atom composite formed by supplying the atoms on the surface of the crystal enables smooth doping thereof to produce the crystal having the high density dopant or a low resistance.

12 Claims, 5 Drawing Sheets

⊚ SUBSTRATE ATOM
○ NUCLEUS ATOM
○ FIRST ATOM
● SECOND ATOM

○ NUCLEUS ATOM
○ FIRST ATOM
● SECOND ATOM

○ C
◯ Aℓ
● N

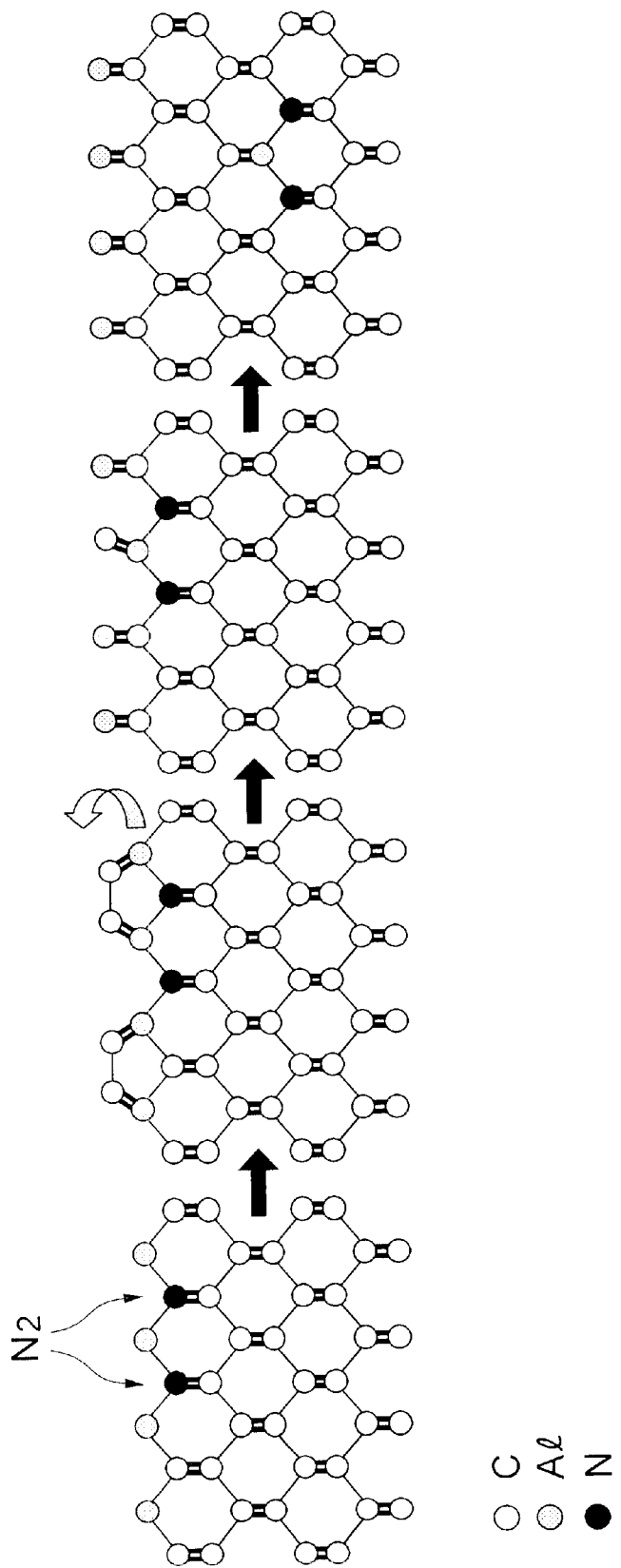

METHOD FOR GROWING CRYSTALS HAVING IMPURITIES AND CRYSTALS PREPARED THEREBY

BACKGROUND OF THE INVENTION (a) Field of the Invention

The present invention relates to a crystal layer including conductivity-providing impurities and a method for epitaxially growing the crystal, more in detail, to a technique for adding impurities using a so-called surfactant layer epitaxial technique in which a surfactant layer including a single atomic layer composed of foreign atoms is adsorbed on the surface of a host crystal and in which nucleus atoms arriving on the surfactant layer are sequentially replaced with the surfactant layer to grow the host crystal.

(b) Description of the Related Art

A wide gap semiconductor material such as diamond is greatly expected to be employed for a light emission element and a new device material. A generally employed impurity-addition process such as a thermal diffusion process hardly conducts doping of the impurities providing conductivity to the diamond, and also hardly conducts the formation of an n-type or p-type semiconductor layer thereon having a low resistance (high impurity density) to the diamond. This is because the single n-type or p-type dopant cannot be stably added into a host crystal, and a single n-type or p-type dopant forms a deep level in the host crystal. In order to overcome the problem, a so-called co-doping technique is known in which the host crystal and two different impurities are added. The technique removes instability of an atomic structure resulting from a single element existing alone in the crystal to form a stable and shallow-leveled donor (acceptor) by a three-atom composite of donor (D)-acceptor (A)-donor (D) (or A-D-A) by chemically bonding the two kinds of the impurity atoms.

The co-doping of the diamond is investigated, and a composite including highly soluble nitrogen and boron in diamond as co-dopants (N-B-N) and another composite including phosphorous and highly mobile hydrogen in diamond as co-dopants (P-H-P) are attempted. The co-dopant addition technique supplies a raw material gas having an adjusted partial pressure ratio during the crystal growth to form the composite in the host crystal.

Separately from these, a surfactant layer epitaxy technique is known as a semiconductor crystal growth technique for changing a crystal surface form and for designing a crystal structure. For example, J. M. Lannon Jr., J. S. Gold and C. D. Stinespring, "Evidence for surfactant mediated nucleation and growth of diamond" (Appl. Phy. Lett. 73(No.2), pp. 226–228, 1998) introduces a method of epitaxially growing diamond crystals by supplying a $C_2H_4$ (acetylene) gas under a ultra high vacuum ($4 \times 10^{-10}$ torr.) by employing a silicon layer as the surfactant layer.

Since the co-dopant addition technique conventionally examined simultaneously supplies the two kinds of the dopant raw material gases into a growth gas for forming the host crystal, a probability of forming the co-dopant during the incorporation of the dopant into the host crystal is low, and most of the dopants are incorporated as a single dopant or a two-atom composite. A boron atom which is a p-type dopant and a nitrogen atom which is a n-type dopant form deep levels to obstruct the functions of the target composite dopants, thereby preventing the effective injection of the n-type of p-type carrier into the diamond crystal.

SUMMARY OF THE INVENTION

In view of the foregoing, an object of the present is to effectively add three-atom composite dopants having a high density into a host crystal, thereby forming a low resistance semiconductor crystal layer even in a material to which the doping or the co-doping is heretofore difficult to be performed.

The present invention provides a method including the steps of: (1) supplying first impurity atoms onto a surface of a crystal substrate to form a surfactant layer adsorbed on the surface, and (2) supplying nucleus atoms which bond with the first impurity atoms, (3) repeating step (2) until second impurity atoms are supplied in step (4), and (4) supplying second impurity atoms which bond with the first impurity atoms and the nucleus atoms to epitaxially grow a crystal layer including the nucleus atoms as a crystal nucleus material doped with the first and second impurity atoms.

In accordance with the method for growing the crystal, a high density impurity doping can be achieved to provide the crystal having a high stability of a chemical bonding and substantially no crystal deficiency. The present invention enables the addition of the high density dopant even to the material to which the doping or the co-doping is conventionally difficult to be performed. Even the wide-gap semiconductor material may have a lower resistance p-type or n-type layer.

The above and other objects, features and advantages of the present invention will be more apparent from the following description.

BRIEF DESCRIPTION OF DRAWINGS

FIGS. 6A to 6D are diagrams showing crystal models prepared in succeeding steps in a further example of the present invention.

PREFERRED EMBODIMENTS OF THE INVENTION

Now, the present invention is more specifically described with reference to accompanying drawings.

For crystal growth of the present invention, an epitaxial growth system is used which includes a metal-organic chemical vapor deposition (MOCVD) system and a molecular beam epitaxial (MBE) system. The crystal of a starting substrate material may be the same as a growth crystal for a homo-epitaxial growth or different therefrom for a hetero-epitaxial growth.

Figure 1A:
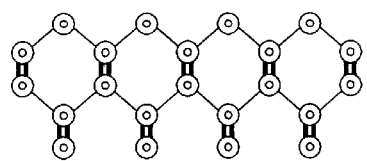
FIGS. 1A to 1J are diagrams showing crystal models in a series of steps for conducting a doping in accordance with an embodiment of the present invention.

Onto the surface of a substrate having a crystal structure shown in FIG. 1A, nucleus atoms, first impurity atoms for forming a surfactant layer and second impurity atoms for forming a three-atom composite together with nucleus atoms and the first impurity atoms are supplied simultaneously or one after another.

Figure 1B:
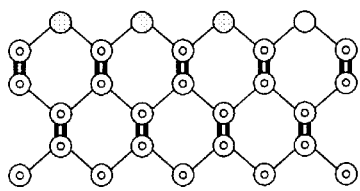

At first, the first impurity atoms supplied to and deposited on the substrate are bonded with the atoms of the substrate to form the surfactant layer composed of the first impurity atoms having a single atom layer on the entire substrate (FIG. 1B). In this stage, the nucleus atoms arriving on the substrate are bonded with the first impurity atoms (FIG. 1C). Then, the nucleus atoms are replaced with the first impurity atoms to be shifted into a state shown in FIG. 1D having a lower energy than the state shown in FIG. 1C, and the first impurity atoms are exposed to the surface. The arrival of the next nucleus atoms repeats the steps shown in FIGS. 1C and 1D, and the first impurity atoms forming the surfactant layer are always exposed to the surface. In other words, the first impurity atoms assist the nucleus atoms in entering into the crystal layer under the surfactant layer. If, however, the second impurity atoms co-exist on the surface, the behavior of the nucleus atoms arriving on the surfactant layer is different.

Figure 1D:
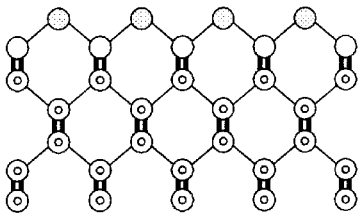
Figure 1C:
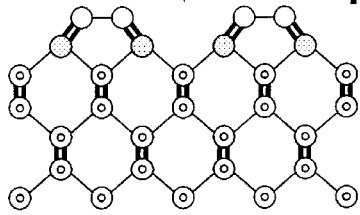
Figure 1E:
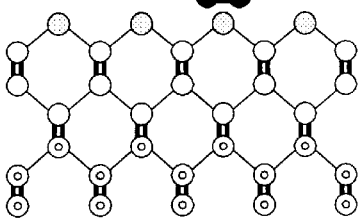
Figure 1F:
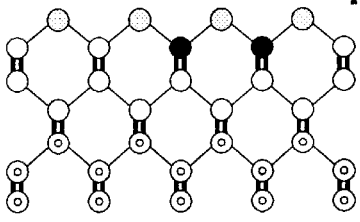
Figure 1H:
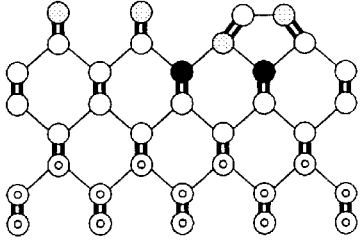
Figure 1G:
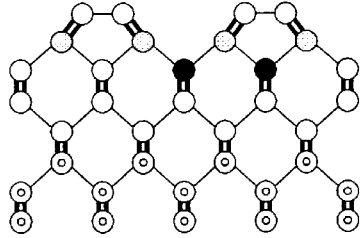
Figure 1I:
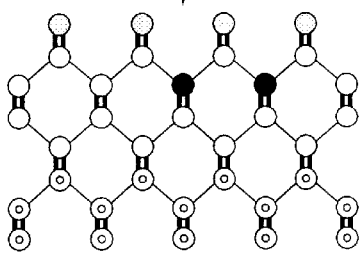
Figure 1J:
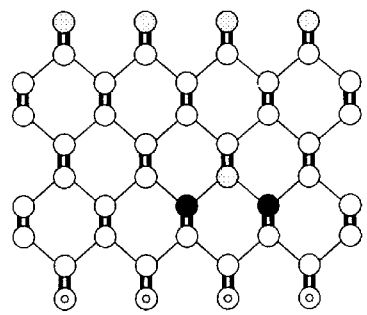

When the second impurity atoms forming a diatomic molecule arrive on the substrate surface (FIG. 1E), the diatomic molecule after dissociation into the two second impurity atoms is replaced with the nucleus atoms as shown in FIG. 1F. At the time of bonding of the first impurity atoms with the second impurity atoms, a three-atom composite is formed. The nucleus atoms arriving on the substrate under the situation are bonded with the first impurity atoms covering the surface as shown in FIG. 1G. In this stage, the first impurity atom existing singly as a surface atom is replaced with the arriving nucleus atoms, but the first impurity atoms existing as a part of the composite are not replaced with the arriving nucleus atoms and remain on the surface acting as an anti-surfactant (FIG. 1H). After the covering of the entire surface with the first impurity atoms (FIG. 1I), the repetition of the steps shown in FIGS. 1C and 1D brings the three-atom composite deep in the host crystal (FIG. 1J).

Any atom can be employed as the first impurity atom which functions as a donor or an acceptor with respect to the nucleus forming crystal and has the total energy at the state of FIG. 1C higher than that of FIG. 1D. When the host crystal is a diamond crystal, aluminum (Al), gallium (Ga), indium (In), phosphorus (P), arsenic (As) and antimony (Sb) can be used as the first impurity atom in accordance with first-principles calculation conducted by the present inventors.

The second impurity atom exhibits a type of conductivity reverse to that of the first impurity atom, and is so selected that, when the second impurity atoms form the composite together with the first impurity atoms, the composite in which the first impurity atoms are not replaced with the arriving nucleus atoms has a lower energy than that in which the first impurity atoms are replaced. When the host crystal is a diamond crystal, nitrogen (N) and boron (B) can be used as the second impurity atom in accordance with the first-principles calculation conducted by the present inventors when one or more of the above atoms are selected as the first impurity atom.

When the above two energy conditions are satisfied, the present invention is practicable even if the host crystal is a compound semiconductor. The three-atom composite may include the two second impurity atoms (elements) and the single first impurity atom (element) constituting the anti-surfactant layer.

Figure 2:
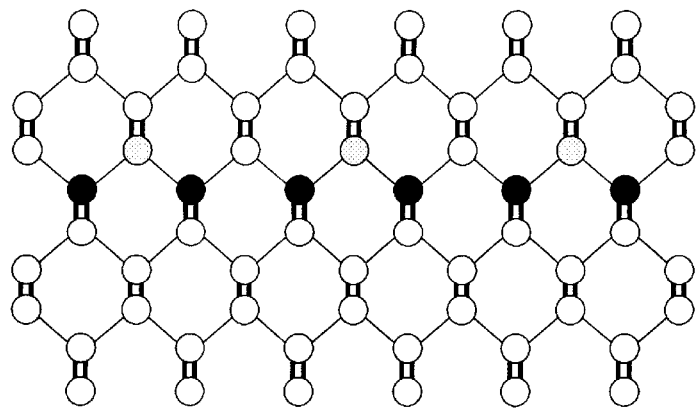
FIG. 2 is a diagram showing another crystal model.

The impurity doping density during the crystal growth can be adjusted by controlling the supply amount of the first and second impurity atoms in the above embodiment. Especially, the stopping of the supply of the second impurity atoms can provide an intrinsic crystal growth layer. When larger amounts of the first and second impurity atoms are supplied at a time, the three-atom composite can be formed in the host crystal at a higher density as shown in FIG. 2. When the larger amounts of the first and second impurity atoms are selectively supplied only on a specified area, a low resistance region can be selectively formed in the crystal. In accordance with the present invention, a doped layer having a nano-level structure can be formed in the host crystal.

A plurality of elements different from one another may be supplied as the second impurity atoms on the anti-surfactant layer. In this case, a plurality of three-atom composites are doped in the host crystal.

Since the first impurity atoms for forming the three-atom composite are always present on the surface as the atom for forming the surfactant layer in the present invention, a probability of forming the three-atom composite is elevated to enable the higher density doping of the three-atom composite in the growing crystal. The lower probability of the individual incorporation of the first and the second impurity atoms as the donor and the acceptor in the growing crystal lowers a probability of forming a deeper level and enables the formation of the impurity doped layer having a lower resistance. When two atoms out of three of the three-atom composite are the second impurity atoms, the three-atom composite can be formed at a higher probability as shown in FIG. 1E than the case when the second impurity atoms are supplied as the diatomic molecule.

Then, examples of the present invention will be described.

Figure 3:
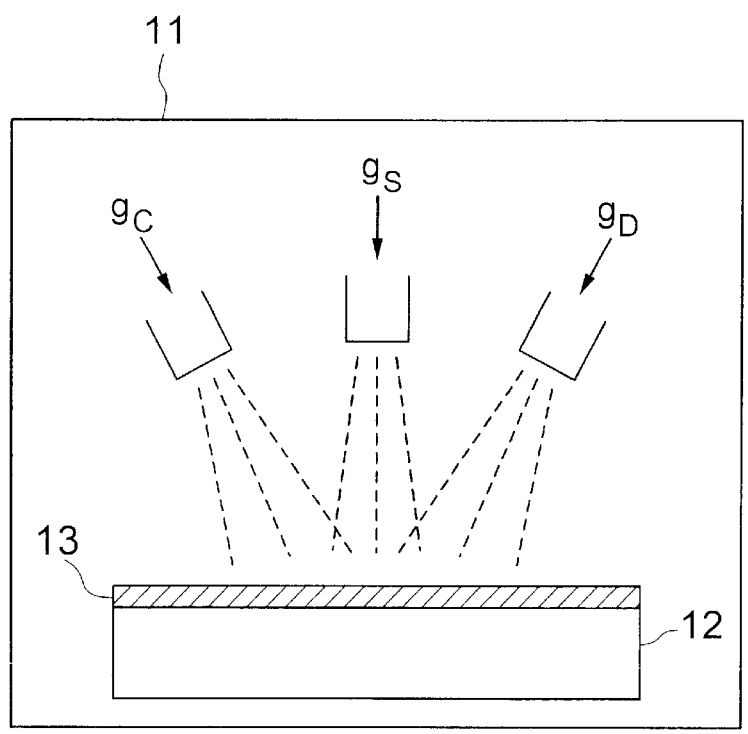
FIG. 3 is a schematic longitudinal view showing an epitaxial growth apparatus employable in the present invention.

Referring to FIG. 3, a diamond crystal 12 is disposed in a vacuum chamber 11 having an ultra high degree of vacuum of $10^{-10}$ Torr., and hydrocarbon ($C_2H_4$), aluminum (Al) and nitrogen (N) are irradiated from a carbon source $g_C$, a surface catalyst source $g_S$ and a dopant source $g_D$, respectively, to conduct the epitaxial growth under a growth temperature of 900±200° C.

Figure 4A:
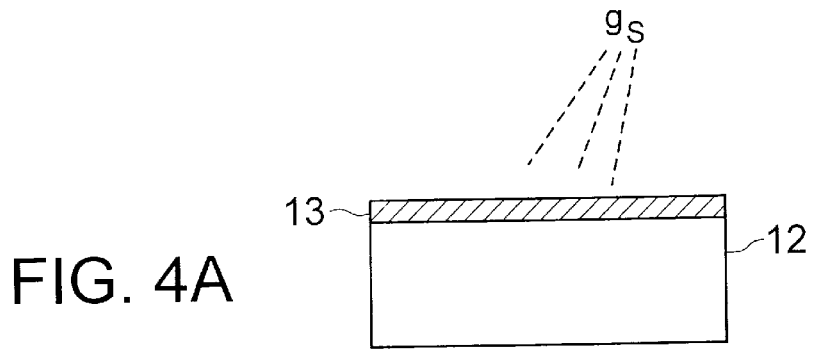
FIGS. 4A to 4D are schematic views showing successive steps for growing a crystal in an example of the present invention.
Figure 4B:
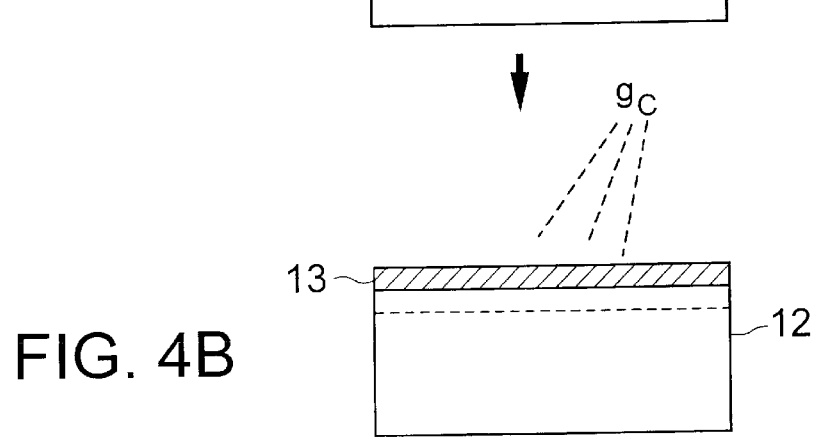
Figure 4C:
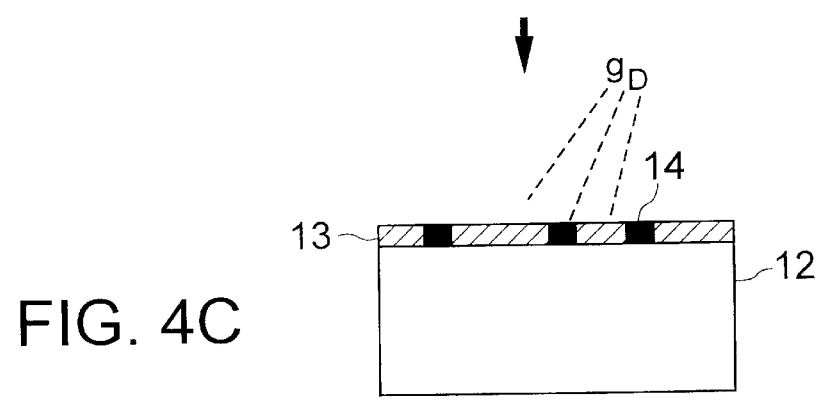

The aluminum is irradiated from the surface catalyst source $g_S$ onto a (001) surface of the diamond crystal 12 which is a substrate for growth (hereinafter referred to as "C (001) surface") to form a surfactant layer 13 as shown in FIG. 4A. Then, the hydrocarbon is supplied from the carbon soured $g_C$ to conduct replacement between the carbon and the aluminum in the surfactant layer to grow the diamond crystal as shown in FIG. 4B. An amount of the nitrogen in accordance with the required doping amount is supplied from the dopant source $g_D$ to the C (001) surface covered with the surfactant layer 13 as shown in FIG. 4C. Thereby, part of the aluminum constituting the surfactant layer 13 is bonded with the irradiated nitrogen to form a co-dopant composite 14 (N—Al—N) which acts as an anti-surfactant.

Figure 4D:
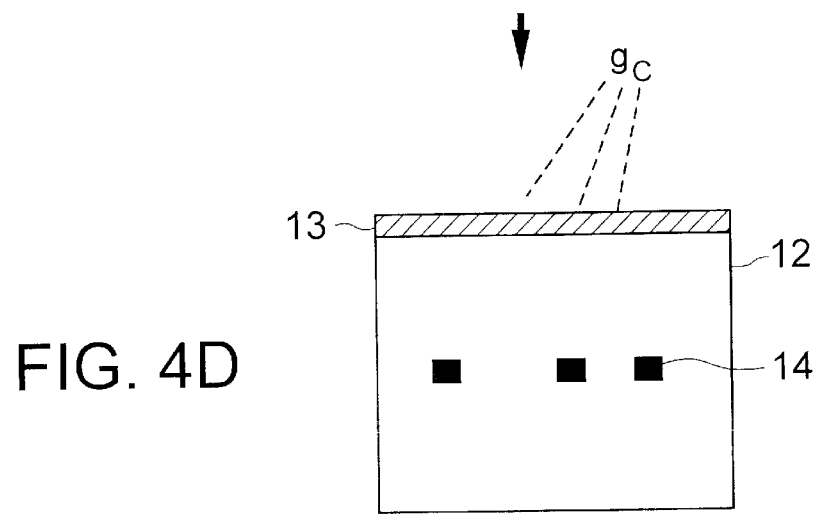

As a result, the surface is covered with the surfactant layer 13 and the codopant composite 14 non-uniformly. When the carbon atoms are supplied in this stage as shown in FIG. 4D, the atoms of the surfactant layer 13 remain in the surface by replacement with the carbon atoms and only the codopant composite 14 is incorporated into the diamond crystal 12. In this manner, the n-type dopant can be added in the diamond crystal.

Similarly, a p-type codopant B—Sb—B can be doped into the diamond crystal by selecting, for example, antimony as the surfactant atom (first impurity atom) and boron as the dopant atom (second impurity atom) to provide the p-type character to the diamond crystal.

Then, a process of growing the diamond crystal will be described more in detail.

Total energy calculations at various atomic arrangement were conducted by the first-principles calculation based on the quantum mechanics, and the results thereof were compared with each other to anticipate a change from a higher energy state to a lower energy state.

Figure 5A:
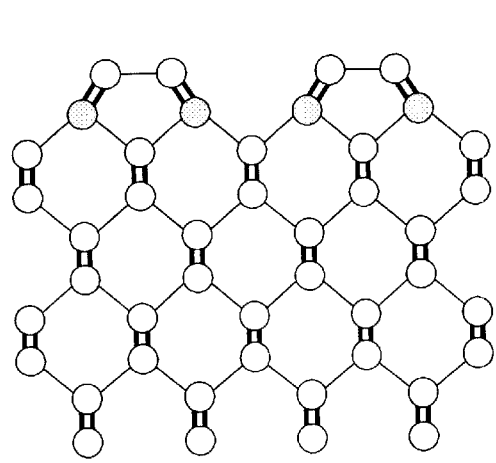
FIGS. 5A and 5B are diagrams showing crystal models prepared in succeeding steps in another example of the present invention.

At first, the diamond (001) surface covered with the aluminum atoms (expressed as "Al/C (001)") was deemed to be an initial atomic arrangement. When the hydrocarbon molecules are supplied on the Al/C (001) at a temperature of 900±200° C., the carbon atoms accumulated on the surface were bonded with the adjacent carbon atoms on the surface to make a structure called a dimer as shown in FIG. 5A. The dimer was terminated with a hydrogen atom (not shown), and its structure is expressed as H/C/Al/C(001). Then, a structure in which the carbon atom bonded to the hydrogen atom and the aluminum atom underlying the carbon atom was exchanged with each other (expressed as H/Al/C/C (001)) was assumed, and total energy thereof and that of the H/C/Al/C(001) were compared. As the result of the first-principles calculation, it was confirmed that the amount of the energy per dimer of the H/Al/C/C(001) was lower than that of the H/C/Al/C(001) by 0.79 eV. This means that the carbon atom on the surface is exchanged with the aluminum atom just below the carbon atom to be incorporated into the diamond. It was also confirmed that the hydrogen atoms were released from the surface as soon as the aluminum atoms were exposed to the surface based on the total energy calculation. In this manner, the final structure included a further carbon atom layer added to the original structure as shown in FIG. 5B.

Figure 5B:
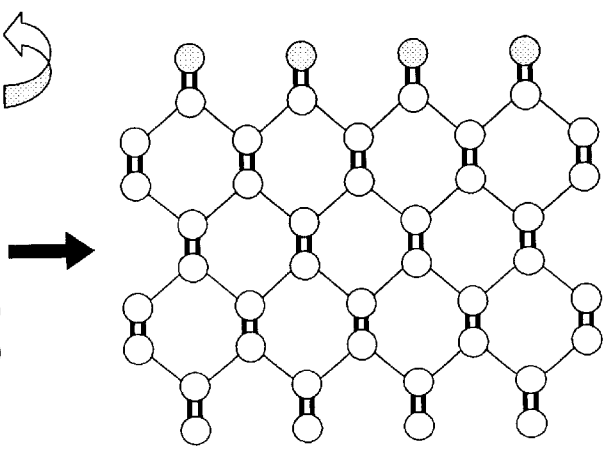

The calculated result that total energy of the structure in FIG. 5B was lower than that of C/Al/C/C(001) by 4.02 eV per dimer showed that the structure in FIG. 5B was considerably stable to prohibit the carbon atoms from being re-exposed to the surface. It was confirmed that the aluminum atoms assisted the epitaxial growth of the diamond and was exposed to the top surface based on the first-principles calculation. It was further confirmed that a similar surfactant atomic effect occurred in gallium, indium, germanium, phosphorous, arsenic and antimony based on the first-principles calculation.

Then, codopant formation by the N—Al—N composite will be described referring to FIGS. 6A to 6D when aluminum and nitrogen are selected as a surface catalyst and an impurity, respectively.

At first, the nitrogen molecules were supplied on the diamond (001) surface covered with the aluminum atoms (the resulting structure is expressed as "N/Al/C(001)"). The first-principles calculation revealed that the supplied nitrogen molecules were immediately dissociated to be subjected to the positional exchange with the aluminum layer as shown in FIG. 6A (the structure of FIG. 6A is expressed as "Al/N/C(001)"). The calculated total energy of the Al/N/C (001) structure was lower than that of the N/Al/C(001) by 2.97 eV per carbon dimer. As a result, a part of the aluminum in the surface catalyst was replaced with the aluminum-nitrogen composite. Total energy of the structure which was formed by covering the above surface, after the exchange between the aluminum and the nitrogen, with hydrocarbon molecules (the structure is expressed as "H/C/Al/N/C(001) ") was lower than that in which the aluminum atoms were unevenly precipitated on the surface (the structure is expressed as "H/Al/C/N/C(001)") by 4.11 eV per carbon dimer.

Accordingly, if the carbon is deposited on the surface including the surfactant layer composed of only the aluminum and the aluminum-nitrogen composite as shown in FIG. 6B, the aluminum in the surfactant layer is replaced with the carbon as shown in FIG. 6C, but the aluminum existing in the composite is not replaced with the carbon and the composite is incorporated into the host crystal. The successive supply of the hydrocarbon enables the complete incorporation of the aluminum-nitrogen composite into the host crystal as shown in FIG. 6D to achieve the doping of the N-type dopant into the diamond crystal.

The first-principles calculation was conducted on the N—Al—N composite structure shown in FIG. 6D incorporated into the diamond to examine the electronic state of the structure. As a result, the composite formed a donor level lower than the bottom of the conduction band of the diamond by 0.4 eV. This value was far smaller than 1.7 eV which was the value of the nitrogen impurity in the diamond. The calculated results showed that the incorporation of the N—Al—N composite realized the n-type doping in the diamond to generate a high electro-conductivity.

The doping of the n-type codopant into the diamond can be similarly conducted by similar processes employing a composite such as N—Ga—N, N—In—N, P—B—P, As—N—As and Sb—B—Sb. On the other hand, a p-type diamond crystal can be formed by employing codopants such as Al—N—Al, B—P—B, B—As—B, B—Sb—B and B—N—B.

An example of forming a nano-level structure in the host crystal employing an epitaxial growth technique will be described.

The N—Al—N composite having a high density can be formed only at a selected region in the host crystal by increasing the supply amount of the nitrogen molecules under similar conditions to those of the above embodiment to accumulate 2 to 3 layers on the selected regions of the surface. Similarly, the composite such as N—Ga—N, N—In—N, P—B—P, As—N—As, Sb—B—Sb, Al—N— Al, B—P—B, B—As—B, B—Sb—B and B—N—B can be generated in the host crystal. In this manner, the nano-level structure having the high electro-conductivity can be generated in the diamond.

Since the above embodiments are described only for examples, the present invention is not limited to the above embodiments and various modifications or alternations can be easily made therefrom by those skilled in the art without departing from the scope of the present invention.

What is claimed is:

1. A method for forming a crystal layer comprising the steps of:
   a. supplying first impurity atoms onto a surface of a crystal substrate to form a surfactant layer adsorbed on the surface,
   b. supplying nucleus atoms which bond with the first impurity atoms, the first impurity atoms remaining on the surface,
   c. repeating step b. until second impurity atoms are supplied in step d.,
   d. supplying second impurity atoms which bond with the first impurity atoms and the nucleus atoms to locally form an anti-surfactant composite on the surface,
   e. supplying nucleus atoms which replace unbonded first impurity atoms on the surface of the crystal substrate and which do not replace first impurity atoms forming part of the anti-surfactant composite, and
   f. after the surface of the crystal substrate is entirely covered by the first impurity atoms, repeating step b. until a crystal layer including the nucleus atoms as a crystal nucleus material doped with the first and second impurity atoms is completely epitaxially grown.

2. The method as defined in claim 1, wherein the crystal layer has a donor-acceptor-donor structure or acceptor-donor-acceptor structure.

3. The method as defined in claim 1, wherein the second impurity atom is selectively supplied on the surfactant layer.

4. The method as defined in claim 1, wherein the second impurity atom includes a plurality of elements.

5. The method as defined in claim 1, wherein the nucleus atoms, or the nucleus atoms and the second impurity atoms are supplied on the surfactant layer by means of a metal-organic chemical vapor deposition method or a molecular beam epitaxial method.

6. The method as defined in claim 1, wherein the second impurity atoms are supplied as a diatomic molecule.

7. The method as defined in claim 1, wherein the nucleic crystal is a diamond crystal, and the first impurity atom is selected from the group consisting of aluminum, gallium, indium, germanium, phosphorus, arsenic and antimony.

8. The method as defined in claim 7, wherein the second impurity atom is nitrogen or boron.

9. A method for forming a crystal layer comprising the steps of:

a. supplying first impurity atoms onto a surface of a crystal substrate to form a surfactant layer adsorbed on the surface, b. supplying nucleus atoms which bond with the first impurity atoms, the first impurity atoms remaining on the surface, c. repeating step b, until second impurity atoms are supplied in step d, and d. supplying second impurity atoms which bond with the first impurity atoms and the nucleus atoms.

10. A crystal formed by the method defined in claim 9, having an n-type or p-type conductivity comprising a diamond crystal and a three-atom composite including a donor-acceptor-donor structure or acceptor-donor-acceptor structure.

11. The crystal as defined in claim 10, wherein the three-atom composite is a nano-level structure.

12. The crystal as defined in claim 10, wherein the donor-acceptor-donor structure or acceptor-donor-acceptor structure is selected from the group consisting of the composites of N—Al—N, N—Ga—N, N—In—N, P—B—P, As—N—As and Sb—B—Sb, Al—N—Al, B—P—B, B—As—B and B—Sb—B.

* * * * *